(12) United States Patent
Milanesi

(10) Patent No.: US 6,762,643 B2
(45) Date of Patent: Jul. 13, 2004

(54) HIGH DUTY CYCLE OFFSET COMPENSATION FOR OPERATIONAL AMPLIFIERS

(75) Inventor: Andrea Milanesi, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/297,730

(22) PCT Filed: Apr. 8, 2002

(86) PCT No.: PCT/IB02/01251
§ 371 (c)(1),
(2), (4) Date: Dec. 6, 2002

(87) PCT Pub. No.: WO02/084862
PCT Pub. Date: Oct. 24, 2002

(65) Prior Publication Data
US 2003/0164730 A1 Sep. 4, 2003

(30) Foreign Application Priority Data
Apr. 11, 2001 (EP) .......................................... 01109017

(51) Int. Cl.⁷ ............................. H03F 1/02; H03F 3/45; H03F 1/30; H03L 5/00
(52) U.S. Cl. ......................... 330/9; 330/259; 330/290; 327/307
(58) Field of Search .......................... 330/9, 259, 290; 327/307

(56) References Cited

U.S. PATENT DOCUMENTS 4,322,687 A * 3/1982 Dwarakanath et al. ......... 330/9
4,781,437 A    11/1988 Shields et al. ............. 350/332
5,397,944 A *  3/1995 DuPuis ...................... 327/307
5,793,230 A *  8/1998 Chu et al. ................... 327/77
6,507,241 B1 * 1/2003 Ritter .......................... 330/9

FOREIGN PATENT DOCUMENTS

EP    1091489 A    4/2001    ............ H03K/5/24

* cited by examiner

*Primary Examiner*—Patricia Nguyen
(74) *Attorney, Agent, or Firm*—Kevin Simons

(57) ABSTRACT

A circuit arrangement comprising an input amplifier stage (31) with two inputs (36, 37) and an output (34) being connectable to an input (35) of an output amplifier stage (32). The circuit furthermore comprises a comparator (33) with a first input (41), a second input (42) and a comparator output (44), a feedback capacitor (43) connected to an offset tuning input (45) of the input amplifier stage (31), and a plurality of switches (S1, S2) that are controllable by switching signals (V1, V2) to allow the circuit to be switched from a first phase to a second phase. During the first phase (1), the output (34) and the input (35) are separated by a first one of the switches (S2) and the two inputs (36, 37) are connected via a second one of the switches (S1). The first input (41) of the comparator (33) is connected to the output (34) of the input amplifier stage (31) and the second input (42) of the comparator (33) is connected to the input (35) of the output amplifier stage (32) such that via the comparator output (44) a charge on the feedback capacitor (43), and hence the voltage at the offset tuning input (45) is altered and an offset of the input amplifier stage (31) is corrected.

31 Claims, 4 Drawing Sheets

HIGH DUTY CYCLE OFFSET COMPENSATION FOR OPERATIONAL AMPLIFIERS

FIELD OF THE INVENTION

The present invention relates to the offset compensation of operational amplifiers. More particularly, the present invention concerns an offset compensation for use in display drivers for liquid crystal displays.

BACKGROUND OF THE INVENTION

Various approaches are known for the compensation of the offset at the output of operational amplifiers (OpAmps). Two basic approaches for the offset compensation can be distinguished.

The first approach uses a capacitor in order to store the offset. A corresponding block diagram is given in FIG. 1. The circuitry of FIG. 1 works as follows. A series of pulses is applied to the switches S1 and S2 in order to switch the circuit arrangement from a first phase (1) to a second phase (2) and vice versa. The respective lines are not illustrated in FIG. 1. In the phase (1), the switches S1 are closed and the operational amplifier 10 is operated in a unity gain loop where the output voltage at the output 12 of the operational amplifier 10 is equal to the offset voltage (Voff).

During phase (1) the voltage (Voff) at the output 12 is stored in the capacitor 13 (Coff). During phase (2), the switches S1 are open and the switch S2 is closed. The capacitor 13 is thus put in series with the negative input 14 of the operational amplifier 10. Since the offset voltage (Voff) is stored in the capacitor 13 (Coff), the negative and the positive input of the operational amplifier 10 both are at the same potential. As a consequence, the voltage at the output 12 of the operational amplifier 10 is cancelled, provided that the voltage difference between the inputs 15 and 16 is zero too.

An example of such a system is described in U.S. Pat. No. 4,781,437.

It is a typical disadvantage of this first approach that the offset cancellation is degraded by the charge injection caused by the auto-zero switches S1 and S2.

A typical example of a circuit according to the second approach is illustrated in FIG. 2. In this case, a supplementary gain stage 21 is employed. This gain stage 21 provides for a compensation of the offset at the output side of the operational amplifier 20 rather than at the input side. Circuits according to the second approach are also switched from a first phase (1) to a second phase (2) by applying a series of pulses to the switches S1 and S2. During phase (1), the switches S1 are closed and the inputs 24, 25 of the operational amplifier 20 (amplification A1) are connected (shorted together) and the operational amplifier 22 (amplification A2) of the gain stage 21 is operated in a closed loop. The closed loop forces the output 26 of the operational amplifier 23 to a point in the linear region. In phase (2) when the switch S1 on the capacitor 27 opens, the charge that was injected therein yields a supplementary offset voltage. This supplementary offset voltage is amplified by the factor A2 and appears at the output 26. The offset at the output 28 of the operational amplifier 20 is thus compensated.

The two approaches discussed in the preceding sections correct the offset in two phases (1) and (2), which have usually the same length. In other words, these approaches have a duty cycle of about 50%.

In order to be able to obtain a higher duty cycle (up to 100%), a so-called ping pong topology is employed, in which a load at the output side of the operational amplifier can be always driven. This is achieved by adding more stages in parallel and using them in a "multiplexed" way. While one stage compensates the offset, the other one drives the load.

There are applications where a high duty cycle is requested and the time available for the offset correction, during the different phases, can be smaller than the settling time of the whole system. The ping pong approach could theoretically solve this problem, but it implies the doubling (or more) of the circuitry and hence of the silicon chip area.

In applications where hundreds of such circuits are present on the same die, a different solution is needed to obtain a device with a competitive price and silicon area.

It is another disadvantage of known solutions that the transient from the offset correction phase (1) to the active phase (2) is too long.

It is an object of the present invention to provide a scheme that overcomes the disadvantages of know approaches that are either slow or require extra silicon area on the die.

It is a further object of the present invention to provide a scheme that allows for a better offset compensation or even an offset cancellation.

It is another object of the present invention to provide a scheme that allows for an offset compensation in display drivers, and in particular in LCD display drivers.

SUMMARY OF THE INVENTION

The present invention concerns a scheme that allows the output voltage of an amplifier circuit arrangement to be compensated for variations in the offset voltage of the amplifier.

These and other objects are achieved by a circuit arrangement that comprises an input amplifier stage with two inputs and an output being connectable to an input of an output amplifier stage. The circuit arrangement also comprises a comparator with a first input, a second input and a comparator output, a feedback capacitor connected to an offset tuning input of the input amplifier stage, and a plurality of switches that are controllable by switching signals. These signals allow the circuit arrangement to be switched from a first phase (1) to a second phase (2). During the first phase, the output of the input amplifier stage and the input of the output amplifier stage are separated by one of the switches, the two inputs of the input amplifier stage are connected via another switch, the first input of the comparator is connected to the output of the input amplifier stage and the second input of the comparator is connected to the input of the output amplifier stage such that via the comparator output a charge on the feedback capacitor and hence the voltage at the offset tuning input is altered. An offset of the input amplifier stage is thus corrected.

Further advantageous implementations are claimed in the claims 2–16.

Also provided is a display system that comprises a display screen with a plurality of source lines and gate lines, a gate driver, and a source driver module, the display system receiving input signals representing the information that is to be displayed on the display screen. The source driver module comprises a buffer with a circuit arrangement in accordance with the present invention.

Further advantageous implementations of a display system in accordance with the present invention are claimed in the claims 18–19.

The method according to the present invention allows to compensate the offset voltage of an input amplifier stage with two inputs and an output. The input amplifier stage is part of a circuit arrangement that comprises an output amplifier stage with an input that is connectable to the output of the input amplifier stage, a comparator with a first input, a second input and a comparator output, a feedback capacitor connected to an offset tuning input of the input amplifier stage, and several switches. In accordance with the present invention, the following steps are performed in order to compensate the offset voltage of an input amplifier stage:

closing first switches and opening second switches, sensing a voltage difference between the first input and the second input of the comparator in order to generate an output current at the comparator output, charging or discharging the feedback capacitor using the output current, adjusting the offset of the input amplifier stage via the offset tuning input.

Various advantageous implementations and variations of the method are claimed in the claims 21–31.

BRIEF DESCRIPTION OF THE DRAWINGS

For a more complete description of the present invention and for further objects and advantages thereof, reference is made to the following description, taken in conjunction with the accompanying drawings, in which.

DESCRIPTION OF PREFERRED EMBODIMENTS

Figure 1:
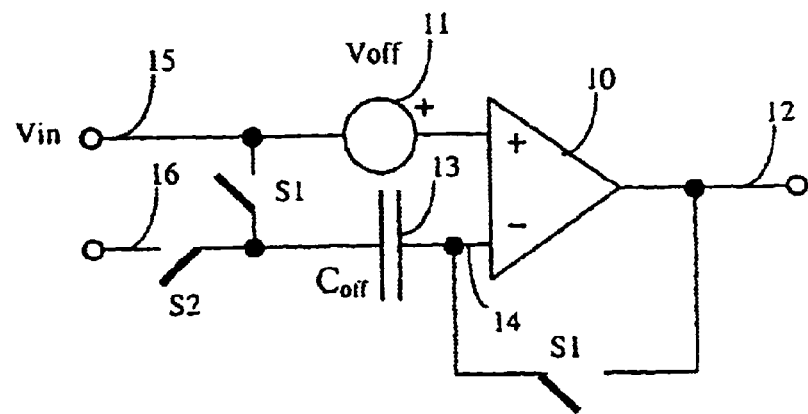
FIG. 1 shows a conventional operational amplifier with offset compensation.
Figure 2:
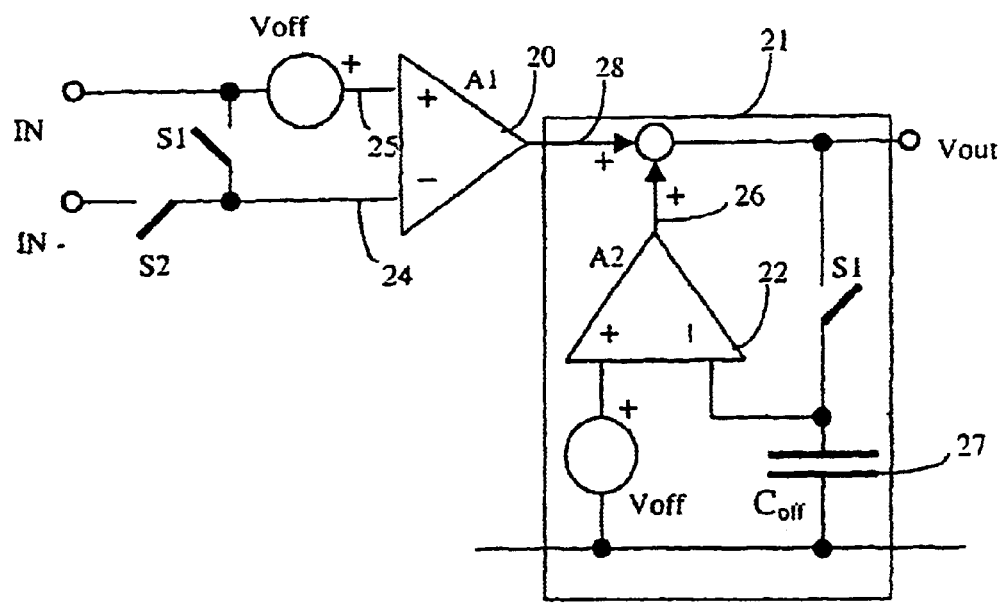
FIG. 2 shows another conventional operational amplifier with a supplementary gain stage used for offset compensation.
Figure 3:
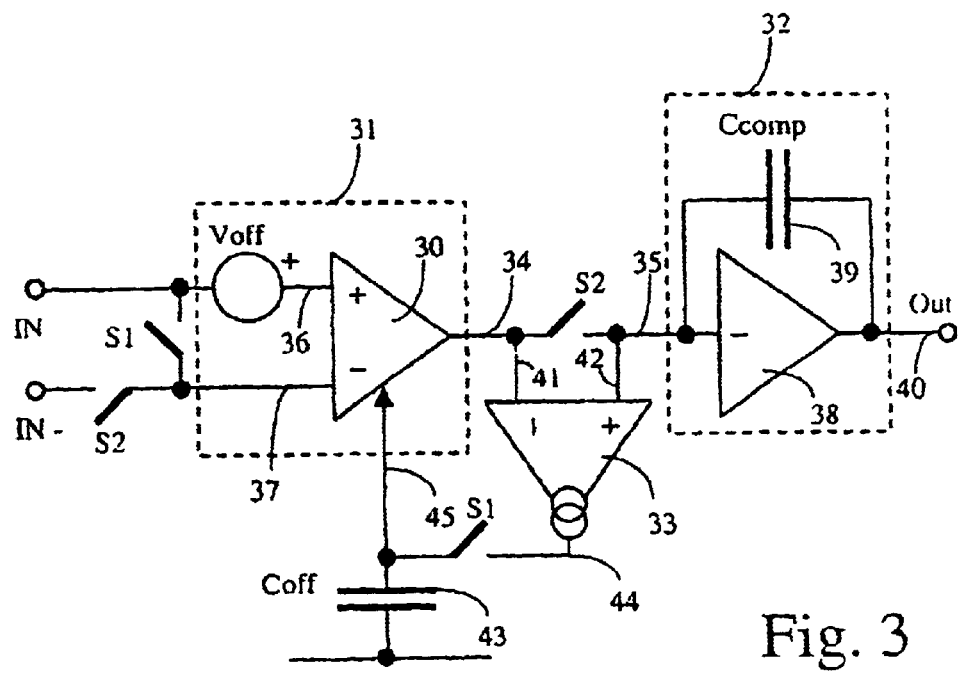
FIG. 3 shows one embodiment, according to the present invention.

The gist of the present invention is explained in connection with a first embodiment. This embodiment is illustrated in FIG. 3. A circuit arrangement according to the present invention, comprises an input amplifier stage 31, an output amplifier stage 32, and a comparator 33. The output 34 of the input amplifier stage 31 is coupled, via a switch S2, to an input 35 of the output amplifier stage 32. The comparator 33 has a first input 41 and a second input 42, the first input 41 being connected to the output 34 of the input amplifier stage 31 and the second input 42 being connected to the input 35 of the output amplifier stage 32.

The comparator output 44 is connected, via a switch S1, to a feedback capacitor 43 (Coff). This feedback capacitor 43 is coupled to an offset tuning input 45 of the input amplifier stage 31. This arrangement allows the offset of the input amplifier stage 31 to be controlled by controlling the voltage across the feedback capacitor 43.

Like in conventional offset compensation circuit arrangements, there are several switches S1 and S2 that are controlled by switching signals V1 and V2, respectively. These switches S1 and S2 are used to switch the circuit arrangement from a first phase (1) to a second phase (2) and vice versa. During phase (1) an offset compensation takes place. The phase (2) is called the active phase, since during this phase the circuit arrangement is used to amplify signals that are applied between the input nodes IN and IN−.

During the phase (1), all switches S1 are closed and the switches S2 are open. The output 34 of the input amplifier stage 31 and the input 35 of the output amplifier stage 32 are separated by one of the switches S2. The first input 41 of the comparator 33 is connected to the output 34 of the input amplifier stage 31 and the second input 42 of the comparator 33 is connected to the input 35 of the output amplifier stage 32. This configuration allows the comparator 33 to sense voltage differences between the output 34 and the input 35. The comparator 33 provides a current at the comparator output 44. Since the switch S1 at the output side of the comparator 33 is closed during phase (1), this current charges or discharges the feedback capacitor 43. The charge on the capacitor 43, and hence the voltage at the offset tuning input 45 of the operational amplifier 30, is thus altered and the offset voltage Voff at the output 34 of the input amplifier stage 31 is corrected. During this phase (1), the two inputs 36 and 37 of the input amplifier stage 31 are connected (shortened) via one of the switches S1.

During the second phase (2), all switches S2 are closed and the switches S1 are open. The output 34 of the input amplifier stage 31 and the input 35 of the output amplifier stage 32 are connected through the first one of the switches S2. The two inputs 36, 37 of the input amplifier stage 31 are separated by the second one of the switches S1. Last but not least, the comparator output 44 is separated from the capacitor 43 by another one of the switches S1. During phase (2), the comparator 33 is not operational since its output 44 is floating. This means that the comparator 33 could also be switched off for current saving purposes.

Figure 4:
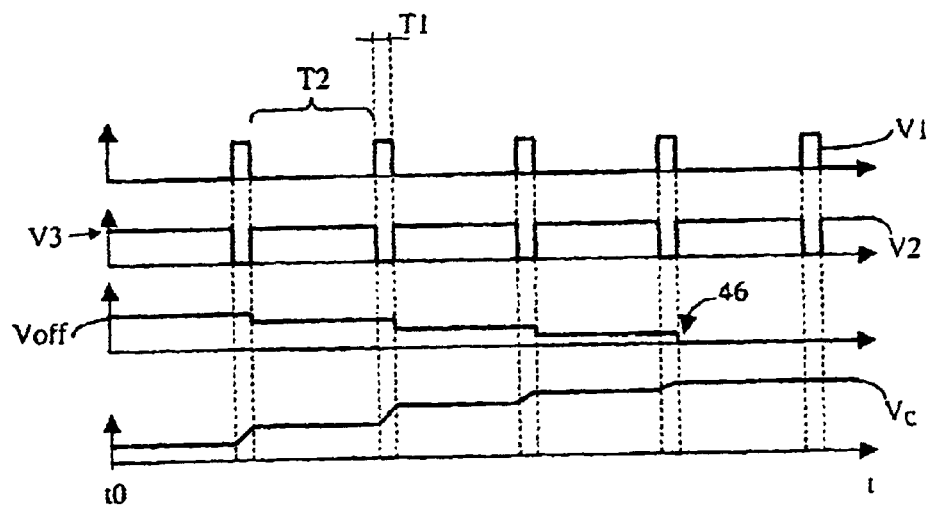
FIG. 4 shows a diagram with the various signals of the embodiment of FIG. 3.

The various voltages are depicted in FIG. 4 as functions of the time t. Please note that the signal curves in FIG. 4 are examples only. The switching signal V1 is the signal that is employed in order to switch the switches S1. When V1 is "high", the switches are closed. The switching signal V2 is the signal that is employed to switch the switches S2. When V2 is "high", the switches are closed. As illustrated in FIG. 4, the switching signal V1 comprises a series of relatively short pulses where the signal is "high". The duration of these pulses is T1. In the given example, the switching signal V2 is the inverted signal V1. In other words, the signal V2 is "low" while the signal V1 is "high" and vice versa. The signal V2 is "high" during the period T2. As can be derived from FIG. 4, the first phase (1), corresponding to the period T1, is shorter than the second phase (2) which corresponds to the period T2. This means that the active period (phase (2)) is much longer than the offset compensation phase (1). Typically, T1 is between 0.1% and 49% of T2. Preferably, T1 is between 1% and 20% of T2.

The two diagrams at the bottom of FIG. 4 illustrate the offset voltage Voff at the input 36 of the operational amplifier 30 and the voltage Vc across the capacitor 43. In the present example, the offset voltage at t0 is V3. Due to the interaction of the comparator 33 and the capacitor 43 with the offset tuning input 45, the offset voltage Voff is step-by-step compensated. During the periods T1, the offset voltage Voff is reduced until it is almost cancelled to zero. This point in time is denoted by the reference number 46 in FIG. 4. In ideal conditions, the offset voltage can be cancelled completely. The Vc across the capacitor 43 increases while the offset voltage Voff is reduced.

The main idea is to correct the offset voltage Voff not in a single phase, but to correct it during more phases in which all the internal nodes of the OpAmp are kept as close as possible at the end value needed to drive a load at the output 40. In this way, the transients between the offset correction phases (1) and the active phases (2) are reduced as much as possible. In given circumstances, the transients can be completely eliminated.

During the offset compensation phase (1) (periods T1), the first and second stages 31 and 32 are parted by the switch S2. The first stage 31 has its two inputs 36, 37 shorted. The second stage 32 works as a gain stage in a unity gain loop where the feedback loop is closed by a compensation capacitor Ccomp 39. The second stage 32 drives the load at output 40 with a constant voltage Vout. In these conditions the output stage 32 is a single pole system and is intrinsically stable. The comparator 33 present in between the two stages 31 and 32 compares the voltage sampled on the input 35 of the second stage 32 with the output voltage at 34 (Vout1) of the first stage 31. The output voltage at 34 (Vout1) will move to an upper or a lower voltage value in conformity with the value of the offset voltage Voff present on its inputs 36, 37. This will cause the comparator 33 to inject or take away charge from the offset cancellation feedback loop capacitor 43, thus modifying its voltage (VC) and correcting the offset voltage Voff.

Figure 5:
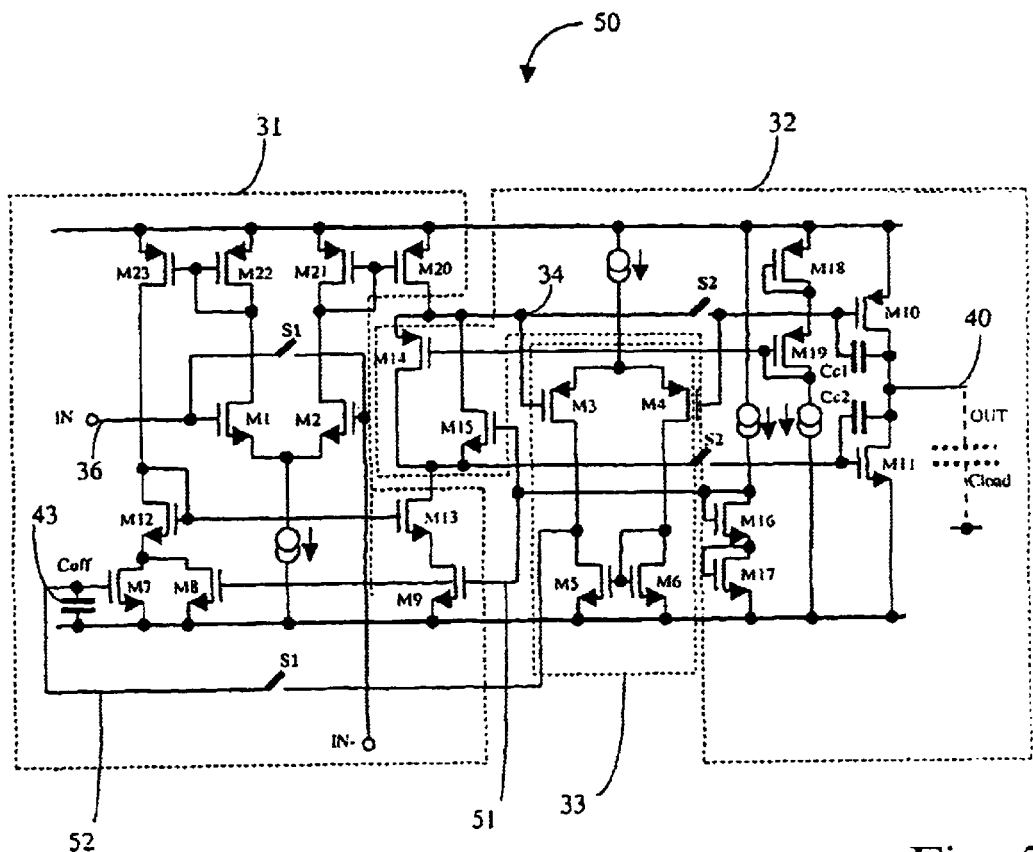
FIG. 5 shows a more detailed embodiment according to the present invention.

A detailed embodiment of the present invention is shown in FIG. 5. The input stage 31 is realized with a mirrored topology. It is called mirrored because it utilizes several current mirrors with transistor pairs. The input doublet of amplifier 30 is realized by the two transistors M1 and M2. The input line 36 in connected to the gate of the transistor M1. The drain of the transistor M20 forms the output 34 of the amplifier 30. The input stage 31 is a one-stage amplifier with a rail-to-rail output.

The offset tuning circuitry in the present example comprises the transistors M7, M8, M9, and the feedback capacitor 43 Coff.

The output stage 32 as a known AB stage, as described by Ron Hogervorst, J. P. Tero, R. G. H. Eschauzier and J. H. Huijsing in "A Compact Power Efficient 3V CMOS Rail-to-Rail Input/Output Operational Amplifier for VLSI Cell Libraries", IEEE J. of Solid-State Circuits, Vol. 29, No. 12, pp. 1505–1513, December 1994, for example. Class AB-amplifiers are well known in the art and are thus not described in detail. The stage 32 comprises the transistors M10, M11 and M14 to M19. Preferably, the output amplifier stage 32 comprises a two-stage operational amplifier with an AB output 40. An operational amplifier with an A-class output, for example, can be used instead of the AB-class output.

An output stage similar to the output stage 32 depicted in FIG. 5 is for example known from the above-mentioned IEEE J. of Solid-State Circuits paper.

The comparator 33 is a common differential stage with transistors M3 to M6. The Offset compensation is realized by the degeneration of the current mirror transistors M12 and M13 through the auxiliary input stage comprising the transistors M7 to M9. The arrangement of the current mirror transistors M12 and M13 is also known as current repeater arrangement. In the given example during the phase (1) the operational amplifier 32 is in a unity gain closed loop configuration through the compensation capacitors Cc1 and Cc2.

The not inverting input 51 of the auxiliary input stage (the gate of the transistor M9) is biased with the two gate to source voltages Vgs17+Vgs16, whereby Vgs16 is the gate to source voltage of the transistor M16 and Vgs17 is the gate to source voltage of the transistor M17. The transistor M9 is thus operated in the linear region as a resistor. After an initial transient (as shown in FIG. 4) the voltage at the inverting input 52 of the auxiliary stage (the gate of the transistor M7) will set to a value in which the resistance of the transistors M7//M8 will degenerate the current mirror comprising the transistors M12 and M13 of the amount needed for the offset correction. The transistor M8 in parallel to M7 is employed in order to create a path to ground for the transistor M12, when the transistor M7 is completely switched off. This circuitry 50 allows the correction only a limited range of offsets, but few tenths of millivolts is more than enough to cover random offset coming from mismatches and process spreads.

During the offset correction phase (switches S1 closed and switches S2 opened) the gate voltages of the transistors M10 and M11 will be sampled on their own gate capacitance. The output of the first stage 31 will change accordingly with its input offset. The comparator 33 will sense any output voltage change in respect to the value sampled on the gate of the transistor M10 and will increase or decrease the voltage across the feedback capacitor 43 (Coff) by switching the bias current flowing in the transistors M3 and M4. During the normal working mode (phase (2) where the signal V2 is logic "high") the current flowing in the transistors M3 and M4 can be switched off to reduce the current consumption as much as possible.

The transistors M3, M4, M10, M14, M18, M19, M20, M21, M22, and M23 are p-type MOSFETs and the other transistors are n-type MOSFETs.

While the embodiment depicted in FIG. 5 comprises n-type and p-type MOSFET transistors, the present invention may be implemented utilizing various types of transistors including npn-type, pnp-type, MESFET or the like where a control voltage applied to a control terminal (such as a gate or base) can control a current through two load terminals (such as an emitter or collector or a source and a drain).

Figure 6:
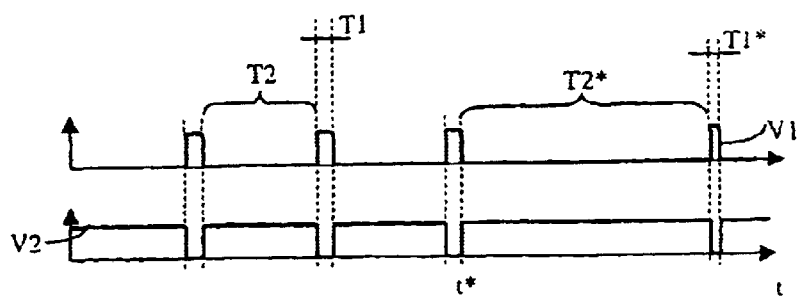
FIG. 6 shows a diagram with the switching signals of another embodiment of the invention.

After the offset voltage has been compensated or even cancelled out completely, the feedback capacitor 43 needs to be refreshed from time to time since it looses charge due to the leakage current. In another embodiment of the present invention the signals V1 and V2 are altered during a third phase (3) called refresh mode. During the refresh mode, the duration T1 can be shorter than during the regular phase (1) and/or the duration T2 can be longer. An example of these three phases (1), (2), and (3) is depicted in the diagram of FIG. 6. During the phases (1) and (2) the signals V1 and V2 are the same as in FIG. 4. After the offset voltage has been compensated, the phase (3) begins. This point in time is depicted as t*. From t* on, the V2 Signal pulses become longer and the V1 pulses shorter. In the given example, T2* is about two times as long as T2 and T1* is half as long as T1. A special driver can be employed that generates the necessary signals V1 and V2.

In another embodiment, this driver comprises a threshold detector that monitors the voltage at the feedback capacitor 43. If the voltage drops below a pre-defined level, the driver increases the frequency of the V1 pulses so that T2* becomes shorter and/or T1* becomes longer.

In another implementation of the invention the switches S1 and S2 are transistor switches, for example of the field effect (FET) type. Preferably, auto-zero switches are employed.

A multiplexer may be employed that generates the switching signals V1 and V2. Please note that such a multiplexer is not necessary in implementations where the switching signals can be supplied by the environment in which the circuitry is employed.

The various embodiments described herein are well suited for use in an LCD driver. In such displays, an analog signal, such as an RGB video signal, is used to control the gray level of each display cell or "pixel". This signal is applied via a plurality of supply buses or source lines of a TFT screen and is selectively gated at the appropriate time to each display cell of the display by gate signals applied to a plurality of row or gate supply buses. Usually, source line drivers are employed to drive the source lines. The various embodiments described herein can be used as a source driver for such a display. In this case, the output 40 of the second stage 32 would be connected to the source line bus of the LCD, for example. The output 40 "sees" a capacitance Cload as schematically depicted in phantom in FIG. 5. This capacitor represents the capacitance of the source line bus. A video signal, for example, an RGB signal, is applied to the input (IN) of the first stage 31. The series of switching signals V1 and V2 enables the LCD driver, in accordance with the present invention, to take samples of the video signal and hold these samples.

Figure 7:
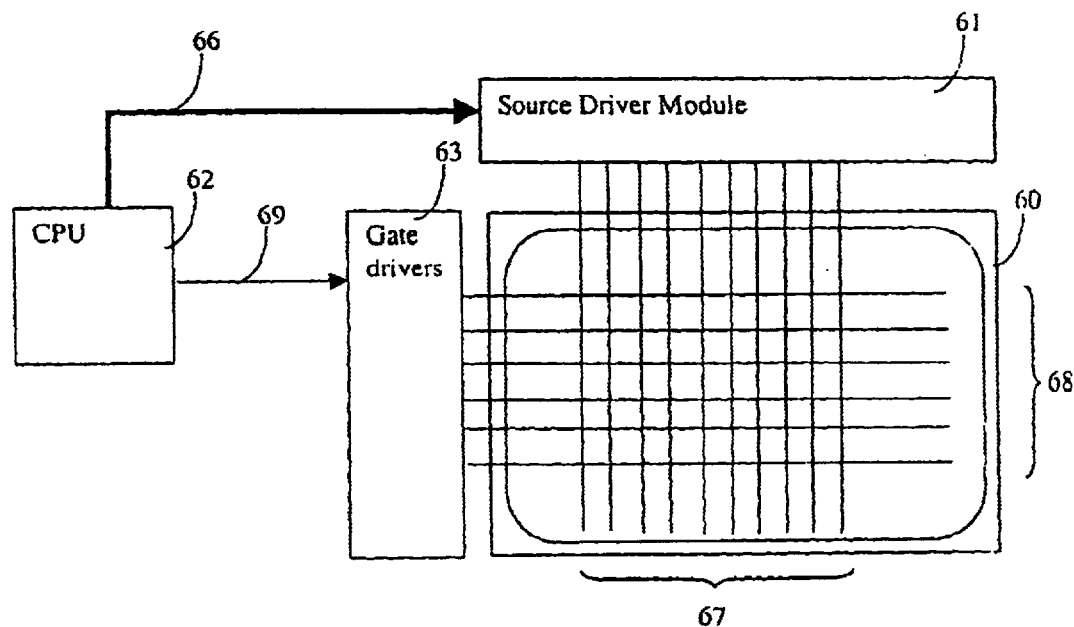
FIG. 7 shows a LCD display according to the present invention.

One embodiment according to the present invention is illustrated in FIG. 7. This Figure shows a block diagram of an LCD display with control circuitry. The LCD display comprises an LCD screen 60 with a plurality of source lines 67 and a plurality of gate lines 68. A source driver module 61 is employed to drive the individual source lines 67. A gate driver 63 is employed that usually drives one whole gate line 68. The CPU 62 controls the scanning of all the gate lines 68 and source lines 67. For this purpose, the CPU 62 provides video signals (data signals and control signals), for example, RGB-signals, via a bus 66 to the source driver module 61 and row timing signals (control signals) via a bus 69 to the gate driver 63. The source driver module 61 may comprise several source drivers. Usually, there is one source driver per source line. It is also possible, however, to use a source driver in a multiplexed fashion such that one and the same source driver can be used to drive several source lines 67.

Figure 8:
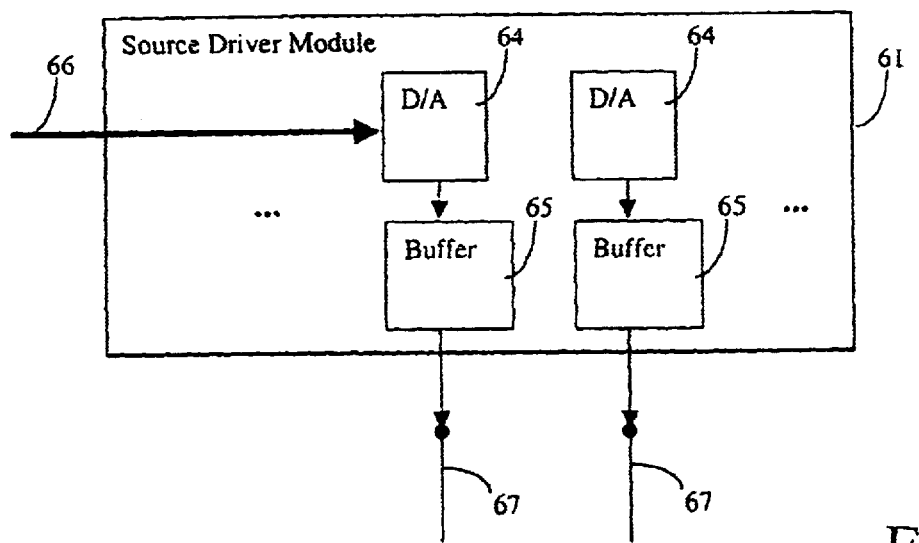
FIG. 8 shows a source driver module of the LCD display of FIG. 7 according to the present invention.

Each source driver comprises a digital-to-analog (D/A) converter 64 and a buffer 65, as illustrated in FIG. 8. The buffers 65 drive the source lines with the voltages needed by each pixel of the LCD screen 60. A circuit arrangement in accordance with the invention is employed inside the buffers 65 in order to compensate for the offset voltage inside the buffer's amplifier.

An LCD driver in accordance with the present invention can be integrated onto a common substrate together with other components used for controlling an LCD display.

It is an advantage of the solution presented herein that in a first approximation the duration T1 of the offset correction phase (1) is independent from the offset cancellation loop bandwidth, and the whole circuit arrangement can be adapted on the timing of the environment in which it is employed.

Another advantage is that during the offset cancellation phases (1) all internal node voltages retain their previous value. This provides for a fast recovery from the phase (1) because no transient is required to bring the internal nodes to their original value.

It is yet another advantage of the present invention that the load at the output can remain connected during both phases (1) and (2).

The present invention is well suited for use in systems and applications where the time that is available for offset compensation is short and a high duty cycle is desired. One type of application is, for example, a TFT display source driver. There is demand for output buffers with a very low offset and an offset correction time reduced as much as possible so as not affect the time needed to drive the display pixels. In these drivers up to 400 output buffers can be present on a single chip, so high duty cycle offset cancellation circuits, low current consumption and small area are necessary.

In the drawings and specification preferred embodiments of the invention have been set forth and, although specific terms are used, the description thus given uses terminology in a generic and descriptive sense only and not for purposes of limitation.

What is claimed is:

1. A circuit arrangement comprising an input amplifier stage (31) with two inputs (36, 37) and an output (34) being connectable to an input (35) of an output amplifier stage (32), a comparator (33) with a first input (41), a second input (42) and a comparator output (44), a feedback capacitor (43) connected to an offset tuning input (45) of the input amplifier stage (31), and a plurality of switches (S1, S2) that are controllable by switching signals (V1, V2) in allow the circuit arrangement to the switched from a firm phase to a second phase, wherein during the first phase,
the output (34) of the input amplifier stage (31) and the input (35) of the output amplifier stage (32) are separated by a first one of the switches (S2),
the two inputs (36, 37) of the input amplifier stage (31) are connected via a second one of the switches (S1),
the first input (41) of the comparator (33) is connected to the output (34) of the input amplifier stage (31) and the second input (42) of the comparator (33) is connected to the input (35) of the output amplifier stage (32) such that via the comparator output (44) a charge on the feedback capacitor (43) and hence the voltage at the offset tuning input (45) is altered and an offset of the input amplifier stage (31) is corrected.

2. A circuit arrangement as claimed in claim 1, wherein during the second phase,
the output (34) of the input amplifier stage (31) and the input (35) of the output amplifier stage (32) are connected by the first one of the switches (S2),
the two inputs (36, 37) of the input amplifier stage (31) are separated by the second one of the switches (S1),
the comparator output (44) is separated from the capacitor (43) by another one of the switches (S1).

3. A circuit arrangement as claimed in claim 1, comprising two switches (S1) that are closed during the first phase and two switches (S2) that are closed during the second phase.

4. A circuit arrangement as claimed is claim 1, wherein the first phase is shorter than the second phase.

5. A circuit arrangement as claimed in claim 1, wherein the output amplifier stage (32) comprises an amplifier (38), preferably an operational amplifier, whose output (40) is connected in a feedback fashion, via a compensation capacitor (39), to the input (35) of the output amplifier stage (32).

6. A circuit arrangement as claimed in claim 1, wherein the output (40) of the amplifier (38) is connectable to a load.

7. A circuit arrangement as claimed in claim 1, wherein the output (40) of the amplifier (38) is intrinsically stable.

8. A circuit arrangement as claimed in claim 1, wherein the comparator (33) generates a current at the output (44) if there is a voltage difference between the first input (41) of the comparator (33) and the second input (42) of the comparator (33).

9. A circuit arrangement as claimed in claim 1, wherein the input amplifier stage (31) is realized in a mirrored topology.

10. A circuit arrangement as claimed in claim 9, wherein the input amplifier stage (31) comprises in current mirror and an auxiliary input stage.

11. A circuit arrangement as claimed in claim 10, wherein the offset at the output (34) of the input amplifier stage (31) is corrected by a degradation of the current mirror through the auxiliary input stage.

12. A circuit arrangement as claimed in claim 1, wherein the output amplifier stage (32) is realized in an AB-topology or in an A-topology.

13. A circuit arrangement as claimed in claim 10, wherein the output amplifier stage (32) comprises a two-stage operational amplifier with an AB output.

14. A circuit arrangement as claimed in claim 1, wherein the comparator (33) is realized as a differential stage.

15. A system comprising a circuit arrangement (30) as claimed in claim 1, wherein the switching signals (V1, V2) are provided by the system to the switched (S1, S2) of the circuit arrangement (50).

16. A system as claimed in claim 15, being part of an display, preferably an LCD display.

17. A display system comprising a display screen (60) with a plurality of source lines (67) and a plurality of gate lines (68), a gate driver (63), and a source driver module (61), the display system receiving input signals representing the information driver module (61) comprising a buffer with a circuit arrangement as claimed in claim 1.

18. A display system as claimed in claim 17, wherein the output amplifier stage (32) is connected to one source line of the plurality of source lines (67).

19. A display system as claimed in claim 16, wherein the display screen (60) is an LCD display screen, preferably a TFT display screen.

20. A method for compensating the offset voltage of an input amplifier stage (31) with two inputs (36, 37) and an output (34), the input amplifier stage (31) being part of a circuit arrangement comprising an output amplifier stage (32) with an input (35) that is connectable to the output (34) of the input amplifier stage (31), a comparator (33) with a first input (41), a second input (42) and a comparator output (44), a feedback capacitor (43) connected to an offset tuning input (45) of the input amplifier stage (31), and first switched (S1) and opening the second switched(S2), which method comprises the steps of (a) closing the first switches (S1) and opening the second switches (S2), (b) sensing a voltage difference between the first input (41) and the second input (42) of the comparator (33) in order to generate an output current at the comparator output (44), (c) charging or discharging the feedback capacitor (43) using the output current, (d) adjusting the offset of the input amplifier stage (31) via the offset tuning input (45) in order to compensate the offset voltage of an input amplifier stage (31).

21. A method as claimed in claim 20, comprising the steps of (e) closing the second switched (S2) and opening the first switched (S1), (f) amplifying an input signal (IN) being applied to one of the two inputs (36, 37) of the input amplifier stage (31) in order to provide a corresponding signal at an output (40) of the output amplifier stage (32).

22. A method as claimed in claim 20, wherein during the step (a) the output (34) of the input amplifier stage (31) is disconnected from the input (35) of the output amplifier stage (32) by one of the second switches (S2).

23. A method as claimed in claim 20, wherein during the step (a) the comparator output (44) is connected to one terminal at the feedback capacitor (43).

24. A method as claimed in claim 20, wherein during the step (a) the two inputs (36, 37) of the input amplifier stage (31) are connected.

25. A method as claimed in claim 21, wherein during the step (e) the output (34) of the input amplifier stage (31) is connected to the input (35) of the output amplifier stage (32) by one of the second switches (S2).

26. A method as claimed in claim 21, wherein during the step (e) the first input (41) and the second input (42) of the comparator (33) are connected together.

27. A method as claimed in claim 20, wherein the steps (a) and (e) are repeated periodically.

28. A method as claimed in claim 20, wherein the steps (a) through (d) are performed during an offset compensation phase and the direction of the offset compensation phase is T1.

29. A method as claimed in claim 28, wherein the steps (e) through (f) are performed during an active phase and the duration of the active phase is T2.

30. A method as claimed in claim 28, wherein T1<T2.

31. A method as claimed in claim 28, wherein T1 amounts to about from 0.1% to 49% of T2, T1 preferably being between 1% and 20% of T2.

* * * * *